United States Patent
Lien et al.

(10) Patent No.: US 7,286,438 B2
(45) Date of Patent: Oct. 23, 2007

(54) DUAL PORT MEMORY CELL WITH REDUCED COUPLING CAPACITANCE AND SMALL CELL SIZE

(75) Inventors: Chuen-Der Lien, Los Altos Hills, CA (US); Pao-Lu Louis Huang, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 7 days.

(21) Appl. No.: 11/403,370

(22) Filed: Apr. 12, 2006

(65) Prior Publication Data

US 2006/0227649 A1 Oct. 12, 2006

Related U.S. Application Data

(60) Provisional application No. 60/670,992, filed on Apr. 12, 2005.

(51) Int. Cl.
*G11C 8/00* (2006.01)
(52) U.S. Cl. .................. 365/230.05; 365/63; 365/154
(58) Field of Classification Search .......... 365/230.05, 365/230.03, 230.08, 154, 156, 63
See application file for complete search history.

(56) References Cited

U.S. PATENT DOCUMENTS

| | | | |
|---|---|---|---|
| 5,287,322 A | 2/1994 | Rastegar | |
| 5,563,820 A | 10/1996 | Wada et al. | |
| 5,808,930 A | 9/1998 | Wada et al. | |
| 5,864,706 A * | 1/1999 | Kurokawa et al. | 712/35 |
| 5,936,875 A | 8/1999 | Kim et al. | |
| 6,084,820 A | 7/2000 | Raszka | |

* cited by examiner

*Primary Examiner*—Gene N. Auduong
(74) *Attorney, Agent, or Firm*—Finnegan, Henderson, et al.

(57) ABSTRACT

A dual or multi port memory device including a first group of bit lines associated with the first port a second group of bit lines associated with the second port, wherein the bit lines are arranged in different metalization layers and separated horizontally to reduce one or both of stray and coupling capacitance associated with the bit lines. In one exemplary embodiment, the bit lines from each port that are in closer proximity to the bit lines of the other (or another) port are disposed in different metallization layers to reduce coupling capacitance therebetween. One or more further embodiments can include $V_{SS}$ or $V_{DD}$ line(s) located horizontally between the bit lines and metal to substrate contacts for the bit lines can be formed in opposite corners of the memory device to further reduce capacitance.

27 Claims, 3 Drawing Sheets

DUAL PORT MEMORY CELL WITH REDUCED COUPLING CAPACITANCE AND SMALL CELL SIZE

RELATED APPLICATION

The present disclosure claims priority from U.S. Provisional Application Ser. No. 60/670,992, filed on Apr. 12, 2005, herein incorporated by reference in its entirety.

BACKGROUND

1. Field of the Invention

The present invention is related to dual- or multi-port memories and, in particular, to bit-line layouts within such memory arrays.

2. Background of the Invention

One problem with dual and multi port memories is the capacitance that occurs between or as a result of the bit lines. For example, current dual or multi port memory devices have long bit lines that produce greater amounts of stray and cross coupling capacitances between the bit lines. Such increased capacitance can produce increased delay times related to access to the memory system and otherwise impact device speed and performance. Additionally, executing of simultaneous read and write operations in a cell in the same column can further exaggerate these capacitance problems. Moreover, capacitively induced cross-talk can occur between bit lines. In sum, all of these factors can significantly decrease the performance of the memory system.

Accordingly, there is a need for dual port memory systems that reduce or minimize the capacitive coupling between and other capacitance associated with bit lines.

SUMMARY

In accordance with the invention, bit line layouts for dual or multi port memory system are disclosed that minimize the capacitance associated with bit lines.

A dual or multi port memory device according to the present invention includes a first group of bit lines associated with the first port a second group of bit lines associated with the second port, wherein the bit lines are arranged in different metalization layers and separated horizontally to reduce one or both of stray and coupling capacitance associated with the bit lines. In one exemplary embodiment, the bit lines from each port that are in closer proximity to the bit lines of the other (or another) port are disposed in different metallization layers to reduce coupling capacitance therebetween. One or more further embodiments can include $V_{SS}$ or $V_{DD}$ line(s) located horizontally between the bit lines and metal to substrate contacts for the bit lines can be formed in opposite corners of the memory device to further reduce capacitance. A ground or Vcc line can also be deposited to further separate the bit lines.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description. These and other embodiments are further discussed below with respect to the following figures.

The figures are not drawn to scale. Elements having the same designation have the same or similar function.

DETAILED DESCRIPTION

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Many semiconductor memory devices and memory cell structures suffer from stray and cross coupling capacitance, as described above, arising between data or bit lines such that read and write operations associated with those lines and thus overall device speed and performance are impacted. Examples of memories subject to these drawbacks are loadless-type CMOS static memory such Static Random Access Memory or "SRAM" and loadless-type associative memory such Content Addressable Memory or "CAM." These memories are characterized, inter alia, by bit lines associated with the two or more ports (i.e., dual port or multi port memories) that are used to access the memory cells. Such memories can be implemented with a variety of layers, including numerous metal layers, with the bit lines typically located within one or two of the metal layers adjacent or otherwise disposed with each other in a manner subject to capacitive coupling and/or cross-talk.

The present invention is directed to dual or multi port memory device including at least a first port, a second port, a first group of bit lines associated with the first port, the first group of bit lines including at least a first bit line, and a second group of bit lines associated with the second port, the second group of bit lines including a second bit line, with the second bit line being disposed in closer proximity to any of the first group of bit lines than any of the remaining bit lines in the second group of bit lines, and the first bit line being disposed in closer proximity to any of the second group of bit lines than any of the remaining bit lines in the second group of bit lines. In one or more embodiments, the first bit line and the second bit line are formed in different metallization layers, or vertical layers, to reduce coupling capacitance therebetween. Further, the second group of bit lines may be separated in at least one direction of a horizontal plane from the first group of bit lines to reduce stray and/or coupling capacitances associated with each bit line. Accordingly, one or both of stray or coupling capacitance associated with the bit lines is reduced due to the vertical and/or horizontal separation between the bit lines.

Figure 1:
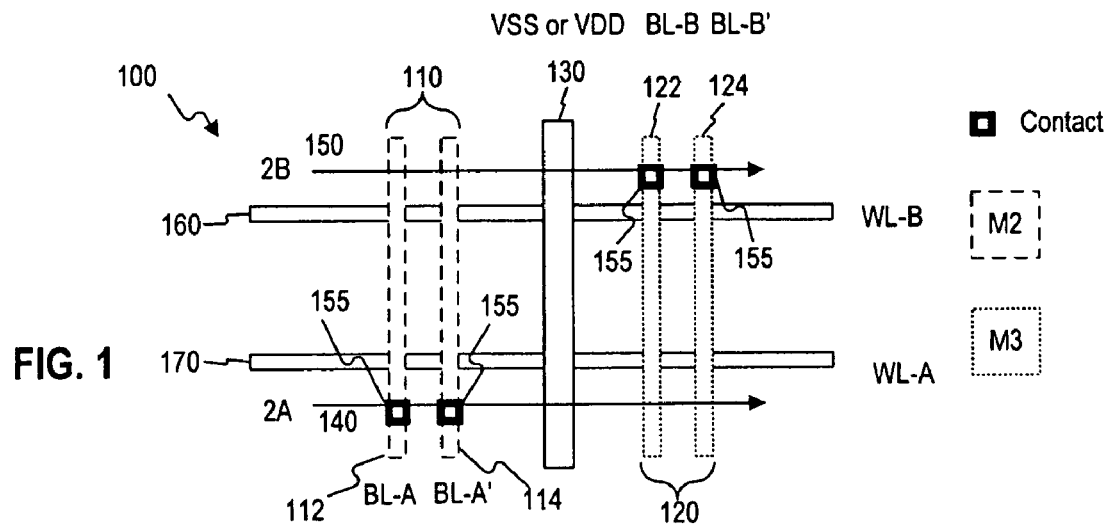
FIG. 1 illustrates a memory device including a bit line layout, consistent with some embodiments of the present invention.

FIG. 1 illustrates an exemplary dual port memory cell 100 comprising two groups of bit lines corresponding to two ports of the cell consistent with some embodiments of the present invention. Memory cell 100 includes a first group of bit lines (BL-A 112 and BL-A' 114), a second group of bit lines (BL-B 122 and BL-B' 124), a source or drain line ($V_{SS}$ or $V_{DD}$) 130, word lines WL-A 160 and WL-B 170, and contacts 155 between the bit lines and substrate or other layers. As shown in FIG. 1, bit lines BL-A 112 and BL-A' 114 correspond to the bit lines of one port of cell 100, while the second group of bit lines, bit lines BL-B 122 and BL-B' 124, correspond to the bit lines of the second port of cell 100. As also shown in FIG. 1, metal-to-substrate contacts 155 of one group of bit lines are arranged in the opposite corner from contacts of the other group of bit lines to reduce coupling capacitance between the two bit lines corresponding to each port and to minimize cell size. A first group of bit lines 110 is disposed in a first metal layer M2, and a second group of bit lines 120 is disposed in a second metal layer M3. Arrangement of the layers is explained in more detail in connections with FIGS. 2A and 2B. A $V_{SS}$ or $V_{DD}$ line 130 within each memory cell may be placed between two groups of bit lines 110 and 120 to further reduce coupling capacitance.

Figure 2A:
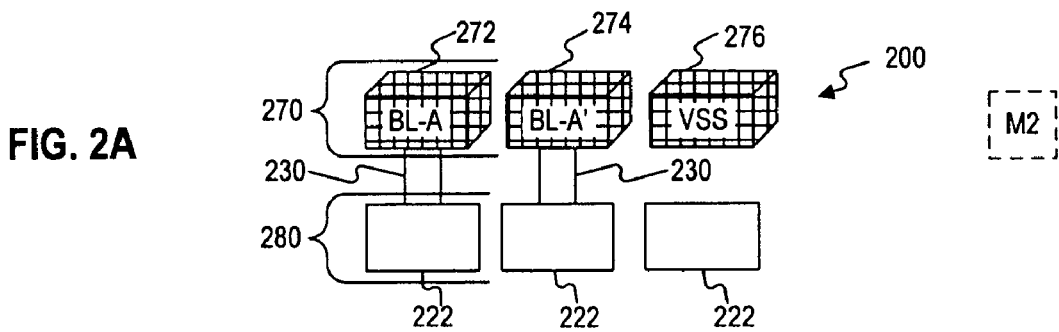
FIGS. 2A and 2B show cross sectional views of the bit line layout illustrated in FIG. 1, consistent with some embodiments of the present invention.
Figure 2B:
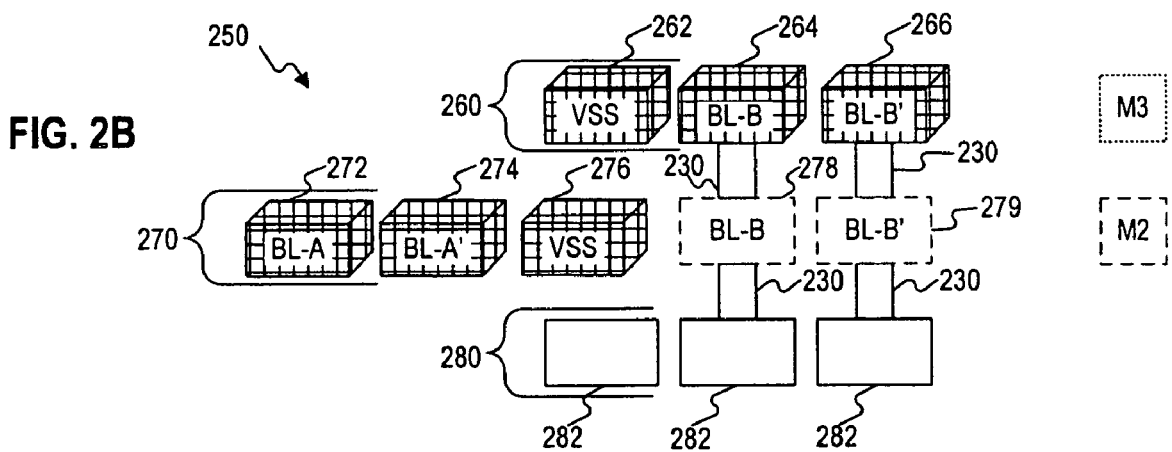

As shown in the cross section of FIG. 2A, the first input port of memory cell 100 may have three lines (BL-A 272, BL-A' 274, and $V_{SS}$ 276) in metal layer M2 270, and several pads 222 in the layer 280 (e.g., substrate, etc.) adjacent or near metal layer M2. In its overall cross section, as shown in FIG. 2B, memory cell 100 thus has three lines (BL-A 272, BL-A' 274, and $V_{SS}$ 276) and two pads (BL-B 278, BL-B' 279) in the first metal layer 270 (metal layer M2), and three lines ($V_{SS}$ 262, BL-B 264, BL-B' 266) in the second metal layer 260 (metal layer M3). Contacts 230 between the lines and pads or elements in the adjacent layers are also shown in FIGS. 2A and 2B. Since pads can be arranged in such a way as to not interfere with lines, there are only three pitches of line and space in each metal layer, compared to five pitches in the prior art. Accordingly, the coupling capacitance between the two ports is reduced, if not eliminated, because the two groups of bit lines are in different metal layers and are separated by $V_{SS}$ or $V_{DD}$ lines. Another advantage of the present dual- or multi-port memory structures is small cell size and reduced coupling capacitance based on such arrangement of bit lines.

Figure 3:
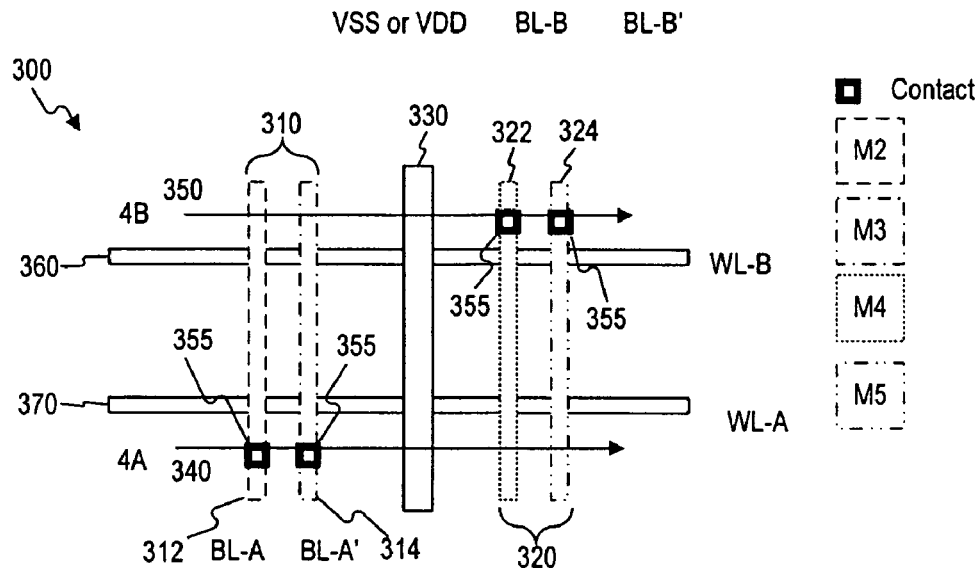
FIG. 3 illustrates a memory device including another bit line layout, consistent with some embodiments of the present invention.

In additional embodiments, the size of dual port memory cell can be further reduced with introduction of additional metal layers. FIG. 3 illustrates another exemplary dual port memory cell 300 comprising two groups of bit lines corresponding to two ports of the cell consistent with some embodiments of the present invention. As with the embodiment of FIG. 1, the contacts 355 of one group of bit lines are arranged in the opposite corner from contacts of the other group of bit lines to reduce coupling capacitance between two ports and to minimize cell size. Memory cell 300 is comprised of a first group of bit lines (BL-A 312 and BL-A' 314), a second group of bit lines (BL-B 322 and BL-B' 324), a source or drain line ($V_{SS}$ or $V_{DD}$) 330, word lines WL-B 360 and WL-A 370, and contacts 355 between the bit lines and substrate or other layers. As shown in FIG. 3, bit lines from the first group of bit lines 310 can be disposed in a first metal layer M2 and a second metal layer M3, respectively, while bit lines the second group of bit lines 320 can be disposed in a third metal layer M4 and a fourth metal layer M5, respectively. A $V_{SS}$ or $V_{DD}$ line 330 may be placed between the two groups of bit lines to further reduce coupling capacitance.

Figure 4A:
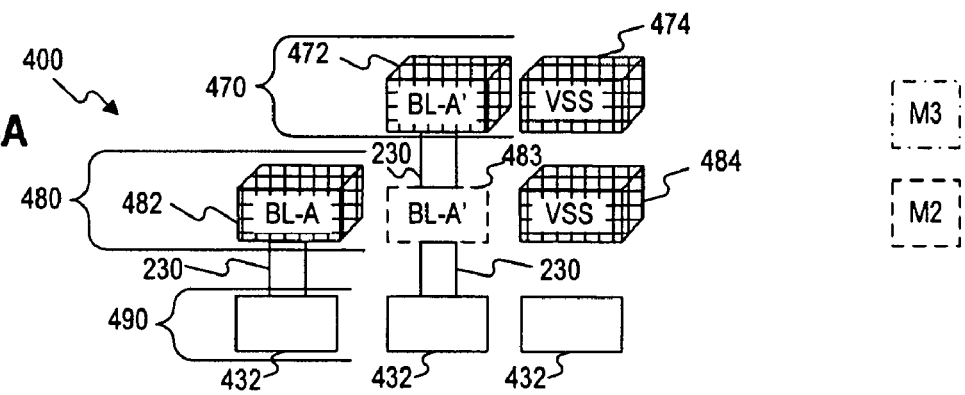
FIGS. 4A and 4B show cross-sectional views of the bit line layout illustrated in FIG. 3, consistent with some embodiments of the present invention.
Figure 4B:
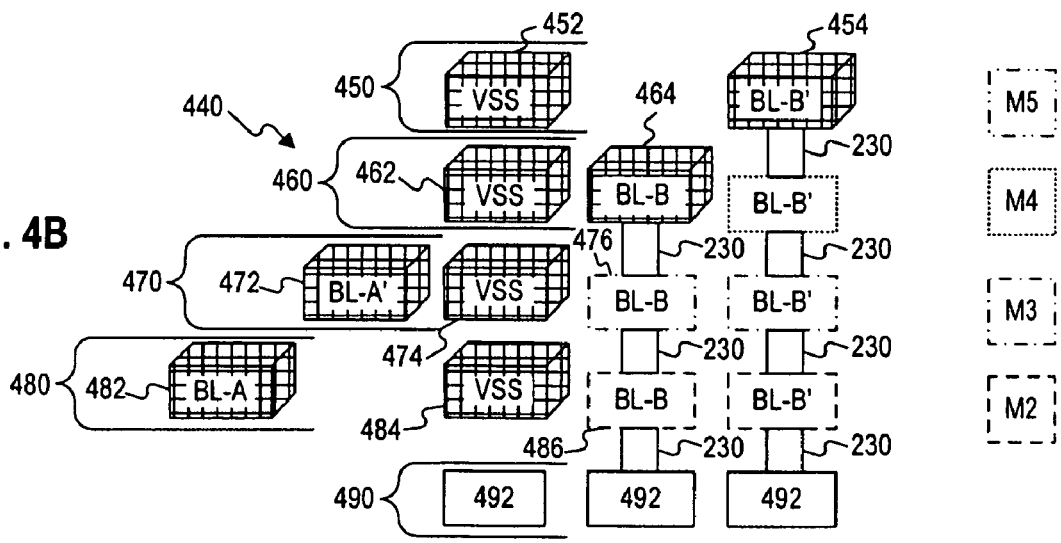

As shown in the cross section of FIG. 4A, the first input port of memory cell 400 may have two lines (BL-A' 412 and $V_{SS}$ 414) in metal layer M3 410, two lines (BL-A 422 and $V_{SS}$ 426) and a pad (BL-A' 424) in metal layer M2 420, and several pads 432 in the layer 430 (e.g., substrate, etc.) adjacent or near metal layer M2. In its overall cross-section, as shown in FIG. 4B, memory cell 300 has two lines (BL-A 482 and $V_{SS}$ 484) and three pads (BL-A' 483, BL-B 486, and BL-B' 480) in metal layer M2 480, two lines (BL-A' 472 and $V_{SS}$ 474) and two pads (BL-B 476 and BL-B' 478) in metal layer M3 470, two lines (BL-B 464 and $V_{SS}$ 462) and one pad (BL-B' 466) in metal layer M4 460, and two lines (BL-B' 454 and $V_{SS}$ 452) in metal layer M5 450. Contacts 230 between the lines and pads or elements in the adjacent layers are also shown in FIGS. 4A and 4B. In this embodiment, there are only two pitches of line and space in each metal layer, therefore cell size can be reduced further with the addition of such further metal layers. Moreover, capacitance associated with the bit lines is further reduced in this embodiment due not only to the vertical and horizontal separation between the two groups of bit lines, but also by virtue of the vertical separation (different metal layers) between adjacent bit lines in bit line pair BL-A and BL-A' and in bit line pair BL-B and BL-B'.

The coupling capacitance may be slightly higher, however, because bit lines from different ports are in the same metal layer.

The two approaches of FIGS. 1-2B and 3-4B may also be combined with a vertical shielding metal layer between two groups of bit lines to reduce coupling capacitance further, although this modification is subject to other issues (i.e., expense, complexity, etc.) related to the inclusion of such an additional metal layer.

Figure 5:
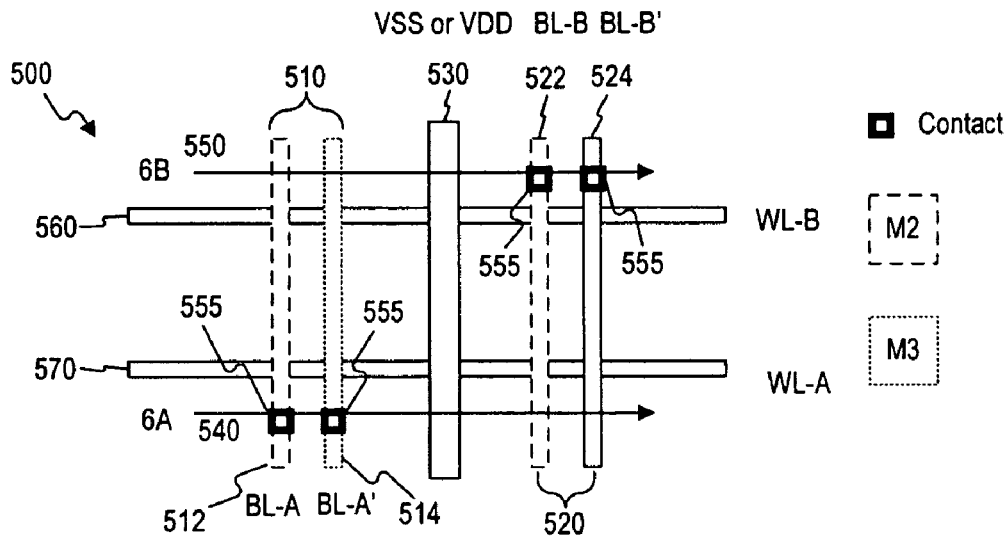
FIG. 5 illustrates a memory device including yet another bit line layout, consistent with some embodiments of the present invention.

FIG. 5 illustrates yet another exemplary dual port memory cell 500 comprising two groups of bit lines corresponding to two ports of the cell consistent with some embodiments of the present invention. As with the embodiment of FIGS. 1 and 3, the contacts 555 of one group of bit lines are arranged in the opposite corner from contacts of the other group of bit lines to reduce coupling capacitance between two ports and to minimize cell size. Memory cell 500 is comprised of a first group of bit lines (BL-A 512 and BL-A' 514), a second group of bit lines (BL-B 522 and BL-B' 524), a source or drain line ($V_{SS}$ or $V_{DD}$) 530, word lines WL-B 560 and WL-A 570, and contacts 555 between the bit lines and substrate or other layers. As shown in FIG. 5, a bit line from the first group of bit lines 510 and a bit line from the second group of bit lines 520 are disposed in a first metal layer M2, and the other bit line from each pair is disposed in a second metal layer M3. A $V_{SS}$ or $V_{DD}$ line 330 may be placed between the two groups of bit lines to further reduce coupling capacitance.

Figure 6A:
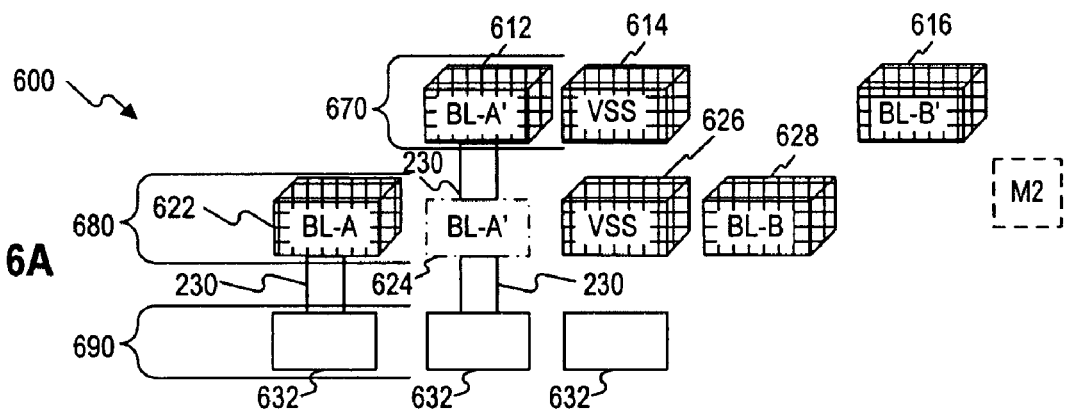
FIGS. 6A and 6B show cross-sectional views of the bit line layout illustrated in FIG. 5, consistent with some embodiments of the present invention.
Figure 6B:
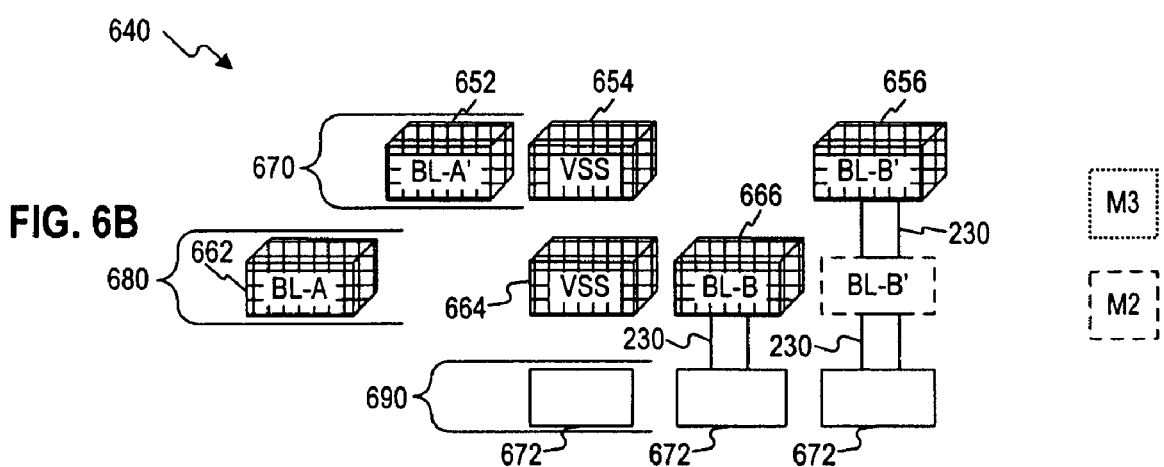

As shown in the cross section of FIG. 6A, the input ports of memory cell 600 may have three lines (BL-A' 612, $V_{SS}$ 614, and BL-B' 616) in metal layer M3 610, three lines (BL-A 622, $V_{SS}$ 626, and BL-B 628) and a pad (BL-A' 624) in metal layer M2 620, and several pads 632 in the layer 630 (e.g., substrate, etc.) adjacent or near metal layer M2. Further, as shown in the cross section of FIG. 6B, memory cell 600 may also have an additional pad (BL-B' 668) in metal layer M2 680, as well as additional pads 672 in the layer 630 (e.g., substrate, etc.) adjacent or near metal layer M2. Contacts 230 between the lines and pads or elements in the adjacent layers are also shown in FIGS. 6A and 6B. In this embodiment, there are only three pitches of line and space in each metal layer. One less pad than the approach illustrated in FIG. 1 makes the layout more efficient. The coupling capacitance may be slightly higher, however, because bit lines from different ports are in the same metal layer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A multi port memory device including a first port and a second port, the memory device comprising:
    a first group of bit lines associated with the first port, the first group of bit lines including a first bit line;
    a second group of bit lines associated with the second port, the second group of bit lines including a second bit line, wherein the second bit line is disposed in closer proximity to any of the first group of bit lines than any of the remaining bit lines in the second group of bit lines, and the first bit line is disposed in closer proximity to any of the second group of bit lines than any of the remaining bit lines in the second group of bit lines;
    wherein the first bit line and the second bit line are formed in different metallization layers; and
    wherein the second group of bit lines is separated in at least one direction of a horizontal plane from the first group of bit lines.

2. The memory device of claim 1, wherein one or both of stray or coupling capacitance associated with the bit lines is reduced due to the vertical and/or horizontal separation between the bit lines.

3. The memory device of claim 1 further comprising first metal-to-substrate contacts of the first group of bit lines arranged in an opposite corner of the multi-port memory device from second metal-to-substrate contacts of the second group of bit lines.

4. The memory device of claim 1 further comprising a $V_{SS}$ or $V_{DD}$ line located horizontally between and separating the first group of bit lines and the second group of bit lines.

5. The memory device of claim 4 further comprising a $V_{SS}$ or $V_{DD}$ line located horizontally between and separating the first group of bit lines and the second group of bit lines.

6. The memory device of claim 1 further comprising a vertical shielding metal layer located horizontally between and separating the first group of bit lines and the second group of bit lines.

7. The memory device of claim 3 further comprising a vertical shielding metal layer located horizontally between and separating the first group of bit lines and the second group of bit lines.

8. The memory device of claim 4 further comprising a vertical shielding metal layer located horizontally between and separating the first group of bit lines and the second group of bit lines.

9. The memory device of claim 5 further comprising a vertical shielding metal layer located horizontally between and separating the first group of bit lines and the second group of bit lines.

10. A multi port memory device including a first port and a second port, the memory device comprising:
    a first group of bit lines associated with the first port, the first group of bit lines including a first bit line and a third bit line;
    a second group of bit lines associated with the second port, the second group of bit lines including a second bit line and a fourth bit line, wherein the second bit line is disposed in closer proximity to any of the first group of bit lines than any of the remaining bit lines in the second group of bit lines, and the first bit line is disposed in closer proximity to any of the second group of bit lines than any of the remaining bit lines in the second group of bit lines;
    wherein the first bit line, the second bit line, the third bit line, and the fourth bit line are formed in different metallization layers; and
    wherein the second group of bit lines is separated in at least one direction of a horizontal plane from the first group of bit lines.

11. The memory device of claim 10, wherein one or both of stray or coupling capacitance associated with the bit lines is reduced due to the vertical and/or horizontal separation between the bit lines.

12. The memory device of claim 10 further comprising first metal-to-substrate contacts of the first group of bit lines arranged in an opposite corner from second metal-to-substrate contacts of the second group of bit lines.

13. The memory device of claim 10 further comprising a $V_{SS}$ or $V_{DD}$ line located horizontally between and separating the first group of bit lines and the second group of bit lines to reduce coupling capacitance.

14. The memory device of claim 12 further comprising a $V_{SS}$ or $V_{DD}$ line located horizontally between and separating the first group of bit lines and the second group of bit lines to reduce coupling capacitance.

15. The memory device of claim 10 further comprising a vertical shielding metal layer located horizontally between and separating the first group of bit lines and the second group of bit lines.

16. The memory device of claim 12 further comprising a vertical shielding metal layer located horizontally between and separating the first group of bit lines and the second group of bit lines.

17. The memory device of claim 13 further comprising a vertical shielding metal layer located horizontally between and separating the first group of bit lines and the second group of bit lines.

18. The memory device of claim 14 further comprising a vertical shielding metal layer located horizontally between and separating the first group of bit lines and the second group of bit lines.

19. A multi port memory device including a first port and a second port, the memory device comprising:
    a first group of bit lines associated with the first port, the first group of bit lines including a first bit line and a third bit line;
    a second group of bit lines associated with the second port, the second group of bit lines including a second bit line and a fourth bit line, wherein the second bit line is disposed in closer proximity to any of the first group of bit lines than any of the remaining bit lines in the second group of bit lines, and the first bit line is disposed in closer proximity to any of the second group of bit lines than any of the remaining bit lines in the second group of bit lines;
    wherein the first bit line and the fourth bit line are disposed in a metallization layer, the second bit line and the third bit line are disposed in another metallization layer, wherein the metallization layer and the another metallization layer are formed as different layers;

wherein the second group of bit lines is separated in at least one direction of a horizontal plane from the first group of bit lines.

20. The memory device of claim 19, wherein one or both of stray or coupling capacitance associated with the bit lines is reduced due to the vertical and/or horizontal separation between the bit lines.

21. The memory device of claim 19 further comprising first metal-to-substrate contacts of the first group of bit lines arranged in an opposite corner from second metal-to-substrate contacts of the second group of bit lines.

22. The memory device of claim 19 further comprising a $V_{SS}$ or $V_{DD}$ line located horizontally between and separating the first group of bit lines and the second group of bit lines to reduce coupling capacitance.

23. The memory device of claim 21 further comprising a $V_{SS}$ or $V_{DD}$ line located horizontally between and separating the first group of bit lines and the second group of bit lines to reduce coupling capacitance.

24. The memory device of claim 19 further comprising a vertical shielding metal layer located horizontally between and separating the first group of bit lines and the second group of bit lines.

25. The memory device of claim 21 further comprising a vertical shielding metal layer located horizontally between and separating the first group of bit lines and the second group of bit lines.

26. The memory device of claim 22 further comprising a vertical shielding metal layer located horizontally between and separating the first group of bit lines and the second group of bit lines.

27. The memory device of claim 23 further comprising a vertical shielding metal layer located horizontally between and separating the first group of bit lines and the second group of bit lines.

* * * * *